United States Patent
Gadgil et al.

[11] Patent Number: 6,048,798
[45] Date of Patent: Apr. 11, 2000

[54] APPARATUS FOR REDUCING PROCESS DRIFT IN INDUCTIVE COUPLED PLASMA ETCHING SUCH AS OXIDE LAYER

[75] Inventors: Prashant Gadgil, Fremont; Janet M. Flanner, Union City; John P. Jordon, San Jose; Adrian Doe, Pleasanton; Robert Chebi, Mountain View, all of Calif.

[73] Assignee: Lam Research Corporation, Fremont, Calif.

[21] Appl. No.: 08/658,258

[22] Filed: Jun. 5, 1996

[51] Int. Cl.[7] ............................ H01L 21/00; C23F 1/00
[52] U.S. Cl. ........................ 438/714; 216/67; 216/68; 427/569
[58] Field of Search ...................... 118/723 R, 723 I, 118/723 IR; 156/345 P, 345 C; 204/298.07, 298.33; 438/714, 720, 722, 723; 216/67, 68; 427/569

[56] References Cited

U.S. PATENT DOCUMENTS

| | | |
|---|---|---|
| 4,340,462 | 7/1982 | Koch . |
| 4,579,618 | 4/1986 | Celestino et al. . |
| 4,842,683 | 6/1989 | Chen et al. ............................ 156/345 |
| 4,948,458 | 8/1990 | Ogle . |
| 5,198,718 | 3/1993 | Davis et al. . |
| 5,200,232 | 4/1993 | Tappan et al. . |
| 5,241,245 | 8/1993 | Barnes . |
| 5,262,029 | 11/1993 | Erskine et al. . |
| 5,282,925 | 2/1994 | Jeng et al. ............................ 156/646 |
| 5,304,279 | 4/1994 | Coultas et al. . |
| 5,346,578 | 9/1994 | Benzing et al. . |
| 5,401,350 | 3/1995 | Patrick et al. . |
| 5,405,480 | 4/1995 | Benzing et al. . |
| 5,464,476 | 11/1995 | Gibb et al. . |
| 5,478,429 | 12/1995 | Komino et al. ........................ 156/345 |
| 5,525,159 | 6/1996 | Hama et al. ........................ 118/723 I |
| 5,529,657 | 6/1996 | Ishii . |
| 5,531,834 | 7/1996 | Ishizuka et al. . |
| 5,567,267 | 10/1996 | Kazama et al. ........................ 156/345 |
| 5,580,385 | 12/1996 | Paranjpe et al. . |
| 5,587,038 | 12/1996 | Ceechi et al. ........................ 156/345 |
| 5,770,098 | 6/1998 | Araki et al. ........................ 216/67 |
| 5,874,361 | 2/1999 | Collins et al. ........................ 438/716 |
| 5,880,037 | 3/1999 | Arleo ........................ 438/740 |

*Primary Examiner*—Bruce Breneman
*Assistant Examiner*—Luz Alejandro
*Attorney, Agent, or Firm*—Burns, Doane, Swecker & Mathis, L.L.P.

[57] ABSTRACT

A plasma processing chamber includes a substrate holder and a gas distribution plate having an inner surface facing the substrate holder, the inner surface being maintained below a threshold temperature to minimize process drift during processing of substrates. The inner surface is cooled by adding a heat transfer gas such as helium to process gas supplied through the gas distribution plate. The chamber can include a dielectric window between an antenna and the gas distribution plate. The control of the temperature of the inner surface facing the substrate minimizes process drift and degradation of the quality of the processed substrates during sequential processing of the substrates such as during oxide etching of semiconductor wafers.

20 Claims, 3 Drawing Sheets

6,048,798

APPARATUS FOR REDUCING PROCESS DRIFT IN INDUCTIVE COUPLED PLASMA ETCHING SUCH AS OXIDE LAYER

FIELD OF THE INVENTION

The invention relates to a plasma processing chamber and to a method of controlling the temperature of an inner surface of a plasma processing chamber. More particularly, the invention relates to a method and processing chamber for cooling an inner surface of a gas distribution plate facing a substrate to minimize process drift when multiple substrates are processed consecutively.

BACKGROUND OF THE INVENTION

Vacuum processing chambers are generally used for chemical vapor depositing (CVD) and etching of materials on substrates by supplying process gas to the vacuum chamber and application of a RF field to the gas. Examples of parallel plate, transformer coupled plasma (TCP, also called inductively coupled plasma or ICP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. application Ser. No. 08/401,524 filed on Mar. 10, 1995. Substrate holders in the form of an electrode can supply radiofrequency (RF) power into the chamber, as disclosed in U.S. Pat. No. 4,579,618.

Plasma processing systems wherein an antenna coupled to a radiofrequency (RF) source energizes gas into a plasma state within a process chamber are disclosed in U.S. Pat. Nos. 4,948,458; 5,198,718; 5,241,245; 5,304,279; 5,346,578; 5,401,350; and 5,405,480. In such systems, the antenna is located outside the process chamber and the RF energy is supplied into the chamber through a dielectric window. Such processing systems can be used for a variety of semiconductor processing applications such as etching, deposition, resist stripping, etc.

SUMMARY OF THE INVENTION

An object of the present invention is to minimize process drift and degradation of the quality of the processed substrates when substrates are processed continuously by controlling the temperature of an inner surface of a gas distribution plate facing the substrate. The temperature control of the inner surface can be achieved by flowing a heat transfer gas through the gas distribution plate and into a space between the gas distribution plate and the substrate.

According to one aspect of the invention, a method of controlling the temperature of the inner surface of the gas distribution plate includes adding helium to the process gas and passing the helium and process gas through the gas distribution plate to maintain the inner surface below a threshold temperature such as less than or equal to 90° C. during oxide etching, and consecutively processing substrates while maintaining the inner surface below the threshold temperature.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

Figure 1:
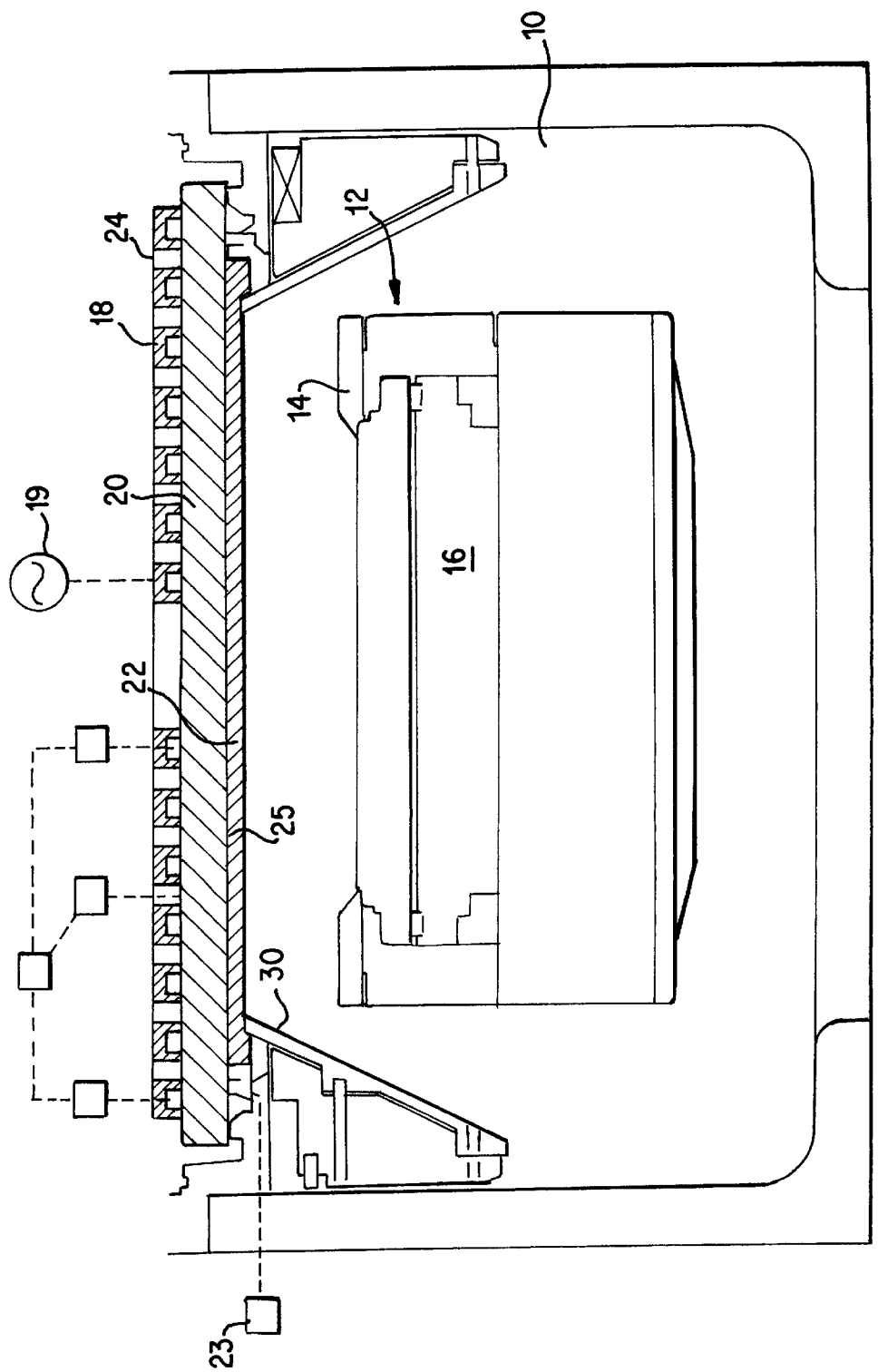
FIG. 1 is a cross sectional view of a vacuum processing chamber according to the present invention.

In plasma etching of substrates, the process results depend on the etch rate, the etch profile, and the etch selectivity, each of which may change as a function of the number of substrates which have been etched consecutively. This change in process results is referred to as process drift. Process drift causes the process results to drift out of a "process window" within which the specifications of the resulting substrate are acceptable for their intended purpose. When process drift occurs and the process results drift out of the "process window" the processed substrates are not within specifications and cannot be used.

Substrates which are etched in an oxide etching process generally include an underlayer, an oxide layer which is to be etched, and a photoresist layer formed on top of the oxide layer. The oxide layer may be one of $SiO_2$, BPSG, PSG, or other oxide material. The underlayer may be Si, TiN, silicide, or other underlying layer or substrate material. The etch selectivity, which is the etch rate of the layer to be etched compared to the photoresist etch rate is preferably around 4:1 or higher. The etch selectivity of the oxide layer compared to the underlayer is preferably greater than the oxide: photoresist etch selectively, e.g., 40:1. These etch selectivities can change during consecutive processing of substrates due to the temperature increase of the processing chamber. For instance, when the chamber heats to above 80° C. during oxide etching, a reaction can occur wherein $CF_3$ forms $CF_2$ and HF with the $CF_2$ leading to increased polymer deposition on the substrate being processed and causing process drift. The same problem may occur for other processes such as deposition reactions or resist stripping wherein chemical interactions with a masked layer cause polymer deposition. Such deposits are undesirable since they can lead to nonuniform processing of the wafers, a problem which worsens as more wafers are processed.

Processing chambers for etching oxide, metal, polysilicon, etc., and film deposition processes generally include a substrate support having an RF biasing electrode, and a substrate clamp for holding the substrate on the support when He backside cooling is performed. Substrate supports are generally liquid cooled to prevent an increase in temperature of the substrate above acceptable levels. However, in processing chambers having an inner surface in proximity to and facing the processed surface of a substrate (e.g., such as in ICP/TCP, helicon and other systems), this inner surface may heat up during processing of substrates and cause undesirable process drift owing to changes in the etch chemistry arising from this temperature change.

In a high density plasma etching reactor, the etch rate of the oxide and the etch selectivity can also change as the number of substrates which have been continuously etched increases due to an increase in the temperature of the above-mentioned inner surface. The etch rate of the oxide decreases due to the increase in temperature of the inner surface until eventually the etching may stop. The etch selectivity, which is the etch rate of the layer to be etched compared to that of the photoresist or underlying layer also changes due to the increasing temperature in the processing chamber.

According to the invention, an inner chamber surface above the substrate is temperature controlled to overcome the process drift problem. The invention is especially useful for preventing process drift during etching of dielectric materials such as silicon dioxide (e.g., doped or undoped TEOS, BPSG, USG (undoped spinon-glass), thermal oxide, plasma oxide, etc.) typically overlying a conductive layer such as silicon, polysilicon, silicide, titanium nitride, aluminum or a non-conductive material such as silicon nitride. According to the invention, process drift can be avoided to such an extent that features (such as contact holes, vias, trenches, etc.) can be provided having dimensions of 0.5 µm and below and aspect ratios ranging from 2:1 to 7:1 can be consistently maintained from substrate to substrate during sequential batch processing of the substrates.

A vacuum processing chamber according to one embodiment of the present invention is illustrated in FIG. 1. The vacuum processing chamber 10 includes a substrate holder 12 providing an RF bias to a substrate supported thereon and a mechanical clamp 14 for clamping the substrate while it is He backcooled. A source of energy for maintaining a high density (e.g. $10^{11}$–$10^{12}$ ions/cm$^3$) plasma in the chamber such as an antenna 18 powered by a suitable RF source and suitable RF impedance matching circuitry inductively couples RF energy into the chamber 10 so as to provide a high density plasma. The chamber is evacuated by suitable vacuum pumping apparatus for maintaining the interior of the chamber at a desired pressure (e.g. below 50 mTorr, typically 1–20 mTorr). A dielectric window 20, e.g., quartz window, is provided between the antenna 18 and the interior of the processing chamber 10 and forms the vacuum wall at the top of the processing chamber 10. A gas distribution plate, commonly called a showerhead 22, is provided beneath the window 20 and includes a plurality of openings such as circular holes (not shown) for delivering process gas supplied by the gas supply 23 to the processing chamber 10. The gas distribution plate 22 can be temperature controlled by passing a heat transfer gas through the gas distribution plate. For example, the heat transfer gas can be added to the process gas and passed through the gas distribution plate along with the process gas. Alternatively, the heat transfer gas can be isolated from the process gas and simply supplied to a gap 25 between the window and the gas distribution plate with or without passing the heat transfer gas through the gas distribution plate and into the space between the gas distribution plate and the substrate.

Figure 2:
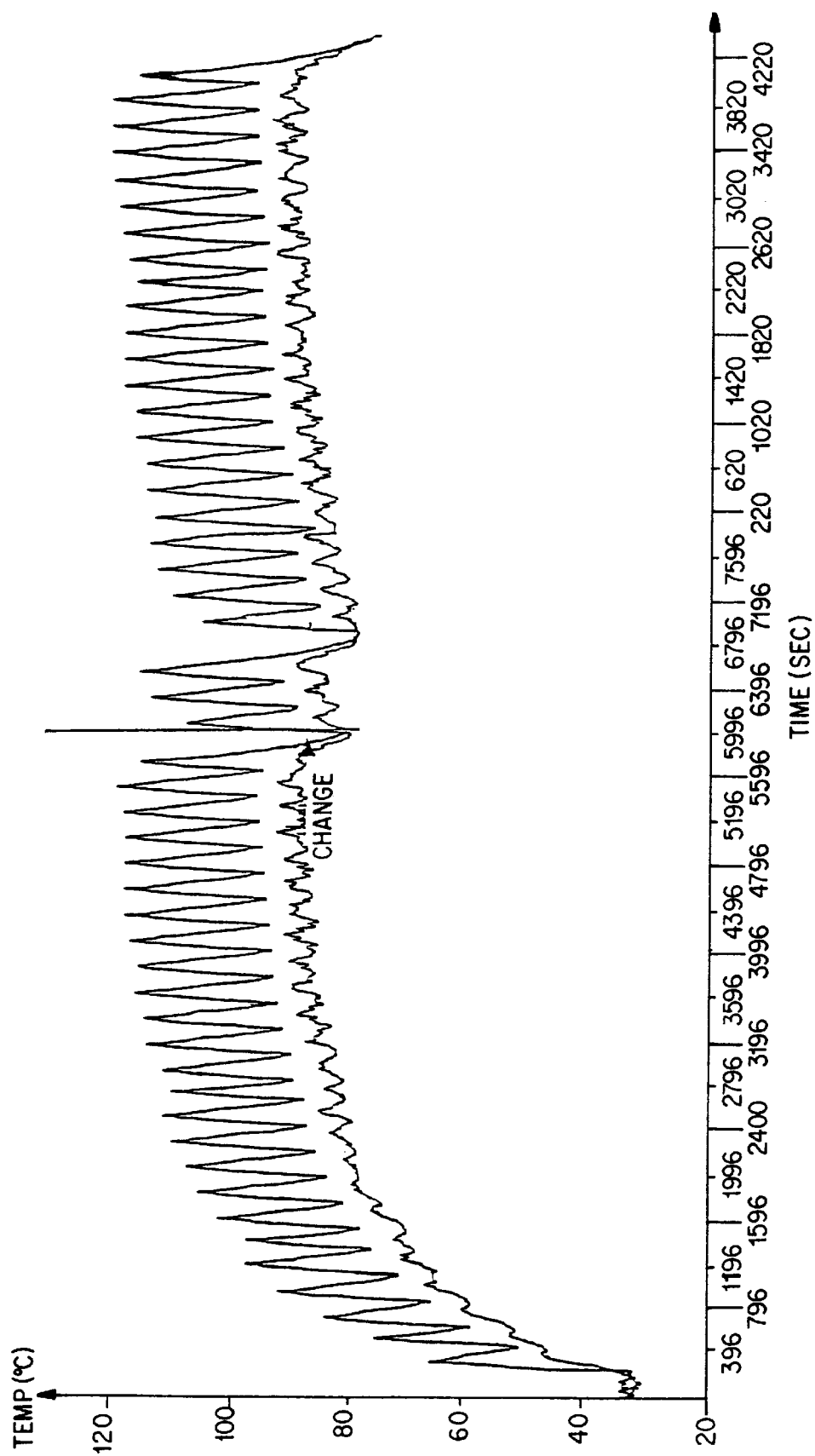
FIG. 2 is a temperature versus time graph which illustrates process drift which occurs during oxide etching of a semiconductor wafer in a processing chamber without cooling a surface of the chamber facing the wafer.
Figure 3A:
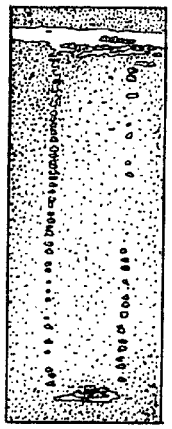
FIGS. 3a–f are photomicrographs of oxide etch profiles for the 2nd, 6th, 12th, 25th, 42nd and 50th wafers of two consecutive runs of 25 wafers etched during the processing illustrated in FIG. 2.
Figure 3B:
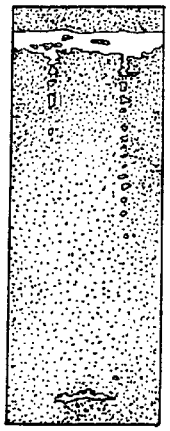
Figure 3C:
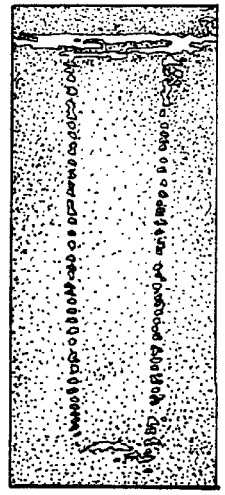
Figure 3D:
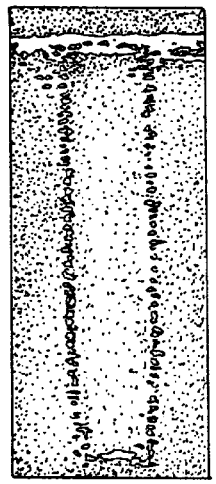
Figure 3E:
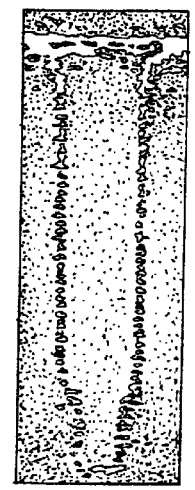
Figure 3F:
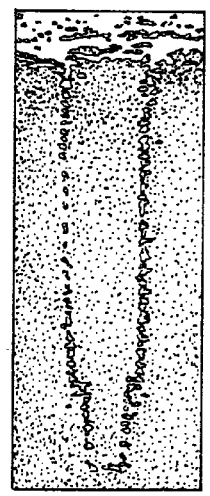

During plasma etching of semiconductor substrates in an inductively coupled system without temperature control of the gas distribution plate, the etch profile, which is the shape of the etch walls, may change due to temperature increase of the inner surface facing the substrate during the etching process. FIG. 2 is a graph of time versus temperature which illustrates the effect of process drift on an oxide etch profile. As shown in FIGS. 3a–f, the etch profiles of the etched substrates which are shown in the six photomicrographs change over time when substrates are processed consecutively. At the beginning of the process the second (FIG. 3a) and sixth substrates (FIG. 3b) to be etched have etch walls which are seen in cross section to be almost vertical. As the process moves on to the 12th (FIG. 3c) and 25th (FIG. 3d) substrates to be etched, the etch walls are less vertical. After twenty five substrates had been processed in the test illustrated in FIG. 2, the process was delayed for a boat (i.e., wafer cassette) change and a transfer module reset. These delays caused breaks in the continuous processing of the substrates and resulted in the temperature drops shown on the graph. After the boat change and transfer module reset, the temperature of the processing chamber and the process window continued to rise. As can be seen from the cross sections of the 42nd (FIG. 3e) and 50th (FIG. 3f) substrates, the etch profile of these substrates was distorted to a great degree. With such distortion of the etch profile, the contact holes which are being etched may not be etched completely through the oxide layer to the underlayer. The failure to etch all the way through the oxide layer can lead to final integrated circuit chips which are inoperative.

A process in accordance with the invention can be carried out as follows. An inductively coupled plasma reactor having a quartz window and alumina gas distribution plate, as shown in FIG. 1, can be operated by supplying the RF antenna with 13.56 MHz RF power, supplying the RF biasing electrode in the substrate support with 4 MHz. or 13.56 MHz RF power, and adding He gas to the process gas supplied to the gas distribution plate. After sequentially processing twenty-five wafers in the chamber, the inner surface of the gas distribution plate can be maintained below a threshold temperature such as below 120° C., preferably below 90° C. For oxide etching, the wafers can be processed by carrying out a 90 second oxide etch using 25 sccm $C_2HF_5$ and 15 sccm $CHF_3$ with 1100 watts applied to the antenna, 1300 watts applied to the bottom RF biasing electrode in the substrate support, a chamber pressure of 5 mTorr and the bottom electrode at −10° C. The oxide etch can be followed by a 10 seconds ashing step using 750 sccm $O_2$ with 400 watts applied to the antenna and 100 watts applied to the RF biasing electrode and a chamber pressure of 15.5 mTorr followed by a second ashing step for 50 seconds using 750 sccm $O_2$ with 400 watts applied to the antenna and 40 watts RF biasing power. Including transport and other overhead operations, the cycle time can be about 230 seconds per wafer.

To maximize cooling of the gas distribution plate, helium can be added to the process gas and continuously flowed through the gas distribution plate even when the process gases for etching and ashing are not being flowed through the gas distribution plate. That is, during wafer transfer into and out of the chamber, a heat transfer gas such as helium can be passed through the gas distribution plate for purposes of maintaining the temperature of the inner surface below the threshold temperature. If desired, the heat transfer gas can be flowed through the gas distribution plate via a separate flow path than that taken by the process gas. In this case, the gas distribution plate could comprise a two layer plate having a first layer facing the window and a second layer facing the substrate. With such a composite window, the first layer can be separated from the window by a gap in which the heat transfer gas is supplied and the first and second layers can be separated by one or more flow passages in which the process gas is supplied. Such an arrangement would permit the heat transfer gas supplied to the gap to remove heat from the inner surface of the second layer which is exposed to the plasma in the open space between the gas distribution plate and the substrate.

According to the invention, heat is removed from the inner surface of the gas distribution plate by providing sufficient gas pressure in the gap between the gas distribution plate and the window. According to a preferred embodiment, the gas distribution plate includes at least one outlet hole through which the heat transfer gas passes into the open space between the gas distribution plate and the substrate. For instance, in the case where the process gas and heat transfer gas are combined and passed through the gas distribution plate, the heat transfer and process gases can be supplied to the gap and passed through a plurality of holes (e.g., 7 holes) having suitable diameters (e.g., about 0.5 mm) to build up pressure of the heat transfer and process gases in the gap. Thus, a desired gas pressure (e.g., 1–100 Torr) can be maintained in the gap to achieve optimized heat flow from the gas distribution plate to the window. For additional cooling, the exterior of the window and/or antenna can be cooled by any desirable technique such as by blowing a gas such as air against the outer surface of the window or passing a temperature controlled fluid through the antenna in one or more channels 24.

In operation, a substrate such as a semiconductor wafer, flat panel display, etc., is positioned on the substrate holder 12 and is typically held in place by an electrostatic clamp, a mechanical clamp, or other clamping mechanism when He backcooling is employed. Process gas is then supplied to the vacuum processing chamber 10 by passing the process gas through a gap between the window 20 and the gas distribution plate 22 and through the plurality of holes which are provided in the gas distribution plate. A suitable gas distribution plate arrangement is disclosed in commonly owned U.S. patent application Ser. No. 08/509,080, the disclosure of which is hereby incorporated by reference. Although a planar and uniformly thick gas distribution plate is illustrated in FIG. 1, the gas distribution plate can have other configurations such as a non-planar shape and/or non-uniform thickness. A high density plasma is then ignited in the space between the substrate and the gas distribution plate by supplying suitable RF power to the antenna 18. A heat transfer gas such as He is added to the process gas to maintain the inner surface of the gas distribution plate 22 at a temperature below a threshold temperature.

During oxide etching, the chamber pressure is typically below 300 mTorr, preferably 2–40 mTorr, the antenna is powered at 200–2000 watts, preferably 400–1600 watts, the RF bias is $\leq$2200 watts, preferably 1200–2200 watts, and the He backpressure is 5–40 Torr, preferably 7–20 Torr. The process gas can include 10–200 sccm $CHF_3$, 10–100 sccm $C_2HF_5$ and/or 10–100 sccm $C_2F_6$ and the heat transfer gas can comprise 50–400 sccm He.

As explained earlier, process drift may lead to changes in the oxide etch rate, the etch profile, and the etch selectivities and such process drift results from buildup of heat in the processing chamber as multiple substrates are consecutively processed. It has been discovered that if the temperature of the inner surface of the gas distribution plate 22 in contact with the plasma processing the substrate can be maintained below the threshold temperature, the process drift can be substantially reduced. The temperatures of other surfaces of the interior of the vacuum processing chamber 10 such as conical ring 30 can also be temperature controlled so as to be below the threshold temperature.

Temperature control of the gas distribution plate can be monitored by suitable temperature controlling apparatus which monitors the temperature of the inner surface directly or indirectly such as by one or more temperature sensors mounted in the gas distribution plate and/or the window. The temperature controlling apparatus could control the flow rate of the He to provide adequate heat transfer between the window and the gas distribution plate. The window can be made of a high thermal conductivity dielectric material such as aluminum nitride which maximizes heat transfer from the window to the gas distribution plate 22. Properties of aluminum nitride include thermal conductivity of 100 w/m-k, density of 3.27 gm/cm$^3$, heat capacity of 0.2 cal/gm-k, and emissivity of 0.75. The gas distribution plate can be made of a material having a high thermal conductivity such as aluminum nitride or other dielectric materials such as aluminum oxide or quartz. Due to the passage of heat transfer gas through the gap between the window and the gas distribution plate, the heat which is received by the gas distribution plate 22 due to ion bombardment from the plasma can be conducted to the window 20 and removed by radiation and/or passing a cooling fluid, e.g., air, in heat transfer contact with the antenna 18 and/or window 20.

The window and gas distribution plate can be separate pieces or formed as a single piece. When formed as a single piece, higher thermal conductivity of the window/gas distribution plate arrangement can be provided and/or the heat transfer across the window and the gas distribution plate can be made more uniform. In making a single piece gas distribution plate, suitable gas passages and outlet holes can be provided in a green ceramic dielectric material which is later sintered to form a unitary plate. In order to prevent plasma from striking in the passages and/or holes, the dimensions of the passages and holes are preferably small enough to avoid conditions under which plasma would form during flow of process gas and powering of the antenna.

The temperature of the gas distribution plate 22 can be controlled by controlling the temperature and/or flow rate of the heat transfer gas. The temperature of the gas distribution plate 22 is desirably maintained below a threshold temperature which depends on the process carried out in the plasma chamber. For instance, in the case of oxide etching, the threshold temperature can be 120° C. or less, preferably 90° C. or less by controlling the flow rate of He gas added to the process gas such as by a flow control mechanism. The temperature of the gas distribution plate may also be controlled by modulating the pressure of the gas behind the gas distribution plate 22 during the etching process.

Dielectric plates used as windows into the vacuum environment of a process chamber are subject to atmospheric pressure which increases as the size of the window increases, e.g., for a 40 cm diameter window the atmospheric pressure is about $10^4$ Kg/m$^2$. This means that on a typical window plate with unsupported diameter, $\phi$=40 cm, the inward force totals about 1200 Kg. Therefore, a high strength material is required, otherwise the window will be excessively thick, e.g. allowing for a 5X safety factor for ceramic, this requires about 2 cm thickness for a quartz window with $\phi$=40 cm. However, the thickness can be substantially reduced by using a high strength material such as aluminum nitride for the window. On the other hand, since process requirements may dictate that the inner surface of the chamber be composed of a process compatible material, for its chemical and/or physical properties, e.g. quartz, the gas distribution plate can be made of a relatively thin plate of quartz since the gas distribution plate need not support the force of the atmospheric pressure. Accordingly, quartz can be used for the gas distribution plate even though it has only moderate mechanical properties, extremely low thermal conductivity, and an extremely low coefficient of thermal expansion. The material of the window can be selected based on vacuum compatibility, dielectric properties, relative process inertness, mechanical and thermal properties. For instance, aluminum nitride is fairly inert, has good dielectric properties (low dielectric constant and loss factor), has mechanical properties similar to alumina including thermal expansion and thermal capacity, but has thermal conductivity approximately five times greater than alumina, i.e. two orders of magnitude greater than that of quartz. Thus, an aluminum nitride window similar to that described for bulk quartz with φ=40 cm, can be <1 cm thick and still support the vacuum force safely. Such a window will only support a temperature gradient of about 1° C. across it for each watt/cm$^2$ dissipated, will have a rather short thermal time constant (seconds rather than minutes), and will therefore still be fairly good with regard to thermal shock.

According to a preferred embodiment of the invention, reduction of process drift can advantageously be achieved with the foregoing apparatus as follows. In particular, inductive coupled plasma etching of an oxide layer can be achieved by use of low RF antenna power and/or addition of helium to the process gas delivered through the gas distribution plate. With this process, photoresist selectivity of over 4:1 and etching of sub-half micron vias within process window specifications and repeatable process performance of over 200 consecutive wafers can be achieved.

In order to maintain temperature control of the gas distribution plate, the power to the RF antenna can be reduced to a suitable level such as below 1000 watts, preferably 750 to 950 watts. During oxide etching, the chamber pressure is typically below 300 mTorr, preferably 2–40 mTorr, the RF bias is ≦2200 watts, preferably 1200–2200 watts, and the He backpressure is 5–40 Torr, preferably 7–20 Torr. The process gas can include 10–200 sccm $CHF_3$, 10–100 sccm $C_2HF_5$ and/or 10–100 sccm $C_2F_6$. In contrast, if the oxide etching is carried out at an RF antenna power of 1000 to 2000 watts unacceptable process drift can occur after consecutively etching less than 25 wafers. However, by maintaining the RF antenna power at a level below 1000 watts, the gas distribution plate will not heat up as much compared to a process wherein the RF antenna power is in the 1000 to 2000 watt range. Additionally, it has surprisingly and unexpectedly been found that by incorporating a heat transfer gas such as 50–400 sccm helium in the process gas passed through the gas distribution plate, it is possible to remove heat from the gas distribution plate. Helium gas is preferred as the heat transfer gas since it is a very efficient conductor of heat and does not take part in the chemical reaction of the plasma etching process. Further, the use of helium in the process gas can maintain the temperature of the gas distribution plate below a desired threshold temperature whether or not the RF antenna power is reduced below 1000 watts and with or without the use of additional temperature control measures.

In order to enhance the removal of heat from the gas distribution plate, the dielectric window can be made of a material having a higher heat conductivity than quartz, the material typically used for the dielectric window of aa inductively coupled reactor. For example, the dielectric window can be made of aluminum nitride which provides strength and cooling capabilities compared to quartz. Further, the gap between the dielectric window and the gas distribution plate can be reduced in size to improve the heat removal efficiency. For instance, the dielectric window and gas distribution plate can be made as a single piece such as by powder metallurgical techniques. Enhanced cooling could also be achieved by active cooling. For instance, a circulating cooled refrigerant could be passed in heat transfer contact with the antenna, dielectric window and/or gas distribution plate in order to remove heat from the gas distribution plate and maintain it at a low enough temperature. Depending on the process performed in the plasma reactor, gases other than helium could be used. For instance, hydrogen gas is a better conductor of heat than helium and thus could be used for maintaining the temperature of the gas distribution plate below a desired threshold temperature provided the hydrogen did not result in significant process shift or poor process performance. However, since helium is typically used for backcooling wafers, process lines for supplying helium to the plasma reactor are available and can be adapted to supplying helium to the gas distribution plate. Use of lower RF antenna power provides advantages with respect to reduction of the thermal budget of the process and potentially less contamination due to reduced plasma bombardment of the gas distribution plate. Moreover, since adequate cooling can be achieved simply by reducing the antenna power and/or adding helium to the process gas, it is not necessary to add active cooling hardware and its associated control circuitry thereby reducing the cost of manufacturing and/or operation of the apparatus.

While the invention has been described in detail with reference to specific embodiments thereof, it will be apparent to one skilled in the art that various changes and modifications can be made, and equivalents employed, without departing from the spirit and scope of the invention.

What is claimed is:

1. A method of processing substrates while controlling the temperature of an inner surface of a plasma processing chamber comprising:

placing a substrate on a substrate holder in the processing chamber wherein a gas distribution plate in the processing chamber faces the substrate holder;

processing the substrate by supplying process gas to the gas distribution plate and flowing the process gas into a space between the gas distribution plate and the substrate;

energizing the process gas in the space into a plasma state by inductively coupling RF energy through the gas distribution plate into the processing chamber;

cooling an inner surface of the gas distribution plate to maintain the inner surface below a threshold temperature and minimize process drift during the processing of the substrate, the cooling being effected by flowing the heat transfer gas through at least one opening in the gas distribution plate and into the space; and consecutively processing substrates in the processing chamber by contacting the substrates with plasma gas while maintaining the inner surface below the threshold temperature, the heat transfer gas also being supplied through the gas distribution plate while the substrates are not being processed by the process gas.

2. The method according to claim 1, wherein the processing chamber includes a substantially planar antenna, the process gas being energized into the plasma state by supplying RF power to the antenna.

3. The method according to claim 2, wherein the step of energizing the process gas into the plasma state comprises supplying less than 1000 watts RF energy to the antenna.

4. The method according to claim 1, wherein the heat transfer gas consists essentially of helium.

5. The method according to claim 1, wherein the processing comprises etching and the threshold temperature is less than or equal to 90° C.

6. The method according to claim 1, wherein the plasma comprises a high density plasma and the substrates are processed by etching an oxide layer on the substrates with the high density plasma while supplying an RF bias to the substrates.

7. The method according to claim 1, wherein the RF energy is supplied by an antenna located outside the chamber and a dielectric window is located between the antenna and the gas distribution plate, the heat transfer gas being added to the process gas and flowed together with the process gas through a plurality of openings in the gas distribution plate.

8. The method according to claim 7, wherein the gas distribution plate is of alumina and the dielectric window is of quartz.

9. The method according to claim 1, wherein the chamber includes a dielectric window, the dielectric window and the gas distribution plate being separated from each other by a gap, the process gas passing through the gap and then through outlets in the gas distribution plate before being energized into the plasma state.

10. The method according to claim 1, wherein the cooling step is carried out by controlling a flow control mechanism to supply the heat transfer gas at a rate which cools an interior surface of the gas distribution plate to below a threshold temperature of 120 degrees.

11. The method according to claim 10, wherein the cooling step is carried out by using a temperature monitor to monitor the temperature of the interior surface and cooperate with the flow control mechanism to supply the heat transfer gas at a rate sufficient to maintain the interior surface below the threshold temperature.

12. The method according to claim 10, wherein the flow control mechanism supplies the heat transfer gas continuously through the gas distribution plate while the substrates are not being processed by the process gas.

13. A method of processing a substrate while controlling the temperature of an inner surface of a plasma processing chamber comprising:

placing a substrate on a substrate holder in the processing chamber wherein a gas distribution plate in the processing chamber faces the substrate holder;

etching an oxide layer on the substrate by supplying process gas to the gas distribution plate and flowing the process gas into a space between the gas distribution plate and the substrate;

energizing the process gas in the space into a plasma state by inductively coupling RF energy through the gas distribution plate into the processing chamber, the process gas being energized into the plasma state by supplying RF power to a substantially planar RF antenna located outside the chamber;

supplying an RF bias to the substrate during the etching; and cooling the gas distribution plate to maintain an inner surface of the gas distribution plate below a threshold temperature during the etching, the cooling being effected by flowing the heat transfer gas through at least one opening in the gas distribution plate and into the space, the heat transfer gas also being supplied through the gas distribution plate while the substrates are not being processed by the process gas.

14. The method according to claim 1, wherein the step of energizing the process gas into the plasma state comprises supplying less than 1000 watts RF energy to the antenna.

15. The method according to claim 13, wherein the heat transfer gas consists essentially of helium.

16. The method according to claim 13, wherein a substantially planar dielectric window is located between the antenna and the gas distribution plate, the gas distribution plate is of alumina and the dielectric window is of quartz, the heat transfer gas being added to the process gas and flowed together with the process gas through a plurality of openings in the gas distribution plate.

17. The method according to claim 13, wherein the process gas includes 10–200 sccm $CHF_3$, 10–100 sccm $C_2HF_5$, 10–100 sccm $C_2F_6$, or mixture thereof.

18. The method according to claim 13, wherein the cooling step is carried out by controlling a flow control mechanism to supply the heat transfer gas at a rate which cools an interior surface of the gas distribution plate to below a threshold temperature of 120 degrees.

19. The method according to claim 18, wherein the cooling step is carried out by using a temperature monitor to monitor the temperature of the interior surface and cooperate with the flow control mechanism to supply the heat transfer gas at a rate sufficient to maintain the interior surface below the threshold temperature.

20. The method according to claim 18, wherein the flow control mechanism supplies the heat transfer gas continuously through the gas distribution plate while the substrates are not being processed by the process gas.

* * * * *